United States Patent [19]

Tarutani et al.

[11] B 4,001,481
[45] Jan. 4, 1977

[54] SUPERCONDUCTIVE ELEMENTS AND METHOD FOR PRODUCING THE SAME

[75] Inventors: Yoshinobu Tarutani, Kokubunji; Ushio Kawabe; Mitsuhiro Kudo, both of Hamura; Sadanori Taguchi, Hachioji, all of Japan

[73] Assignee: Hitachi, Ltd., Japan

[22] Filed: Oct. 5, 1973

[21] Appl. No.: 403,883

[44] Published under the second Trial Voluntary Protest Program on March 23, 1976 as document No. B 403,883.

[30] Foreign Application Priority Data

Oct. 6, 1972 Japan .............................. 47-99801
Jan. 10, 1973 Japan .............................. 48-5217

[52] U.S. Cl. .............................. 428/469; 428/472; 427/62; 427/250
[51] Int. Cl.[2] .................. B05D 5/12; B32B 15/04; C23C 13/02
[58] Field of Search ...... 117/227, 217, 230, 106 R, 117/107.2 R, 93.1 R, 93.4 R, 93.3; 29/599; 338/325; 427/250, 255, 350, 404, 62; 428/470, 471, 472, 469

[56] References Cited

UNITED STATES PATENTS

| | | | |
|---|---|---|---|
| 3,328,200 | 6/1967 | Neugebauer | 117/93.3 |
| 3,472,694 | 10/1969 | Hanak | 117/227 |
| 3,552,352 | 1/1971 | McConnell | 117/93.3 |
| 3,620,833 | 11/1971 | Gleim et al. | 117/212 |

FOREIGN PATENTS OR APPLICATIONS 1,106,797   3/1968   United Kingdom ................ 29/599

OTHER PUBLICATIONS

Foner et al., *Properties of Superconducting Nb$_3$Ga Materials,* In Applied Superconductivity Conference, May 1972, pp. 404–406.
Hammond et al., *Superconducting Properties of Nb$_3$(Al,Ge) Prepared by Vacuum Vapor Deposition of the Elements,* In J. Appl. Phys., vol. 43, No. 5, (May 1972), pp. 2407–2413.
Amatuni, et al., *Linear Thermal Expansion of Quartz & Aluminum Oxide Crystals,* In General Physical Chemistry, vol. 66, 1957, p. 5577, Article 59119m.

Primary Examiner—Cameron K. Weiffenbach
Assistant Examiner—R. Eugene Varndell, Jr.
Attorney, Agent, or Firm—Craig & Antonelli

[57] ABSTRACT

A superconductive element comprising a substrate, at least one face of which is composed of alumina, and a layer of a superconductive compound of the Nb-Al, Nb-Ga, Nb-Al-Ge or Nb-Ga-Al system formed on the alumina face, which exhibits an excellent critical current density in either a low magnetic field or a high magnetic field and simultaneously has a high critical temperature, and in which peeling or cracking is not caused, and a method for preparing such superconductive element comprising the step of vaccum depositing the above-noted superconductive compound on an alumina surface of a substrate.

19 Claims, 17 Drawing Figures

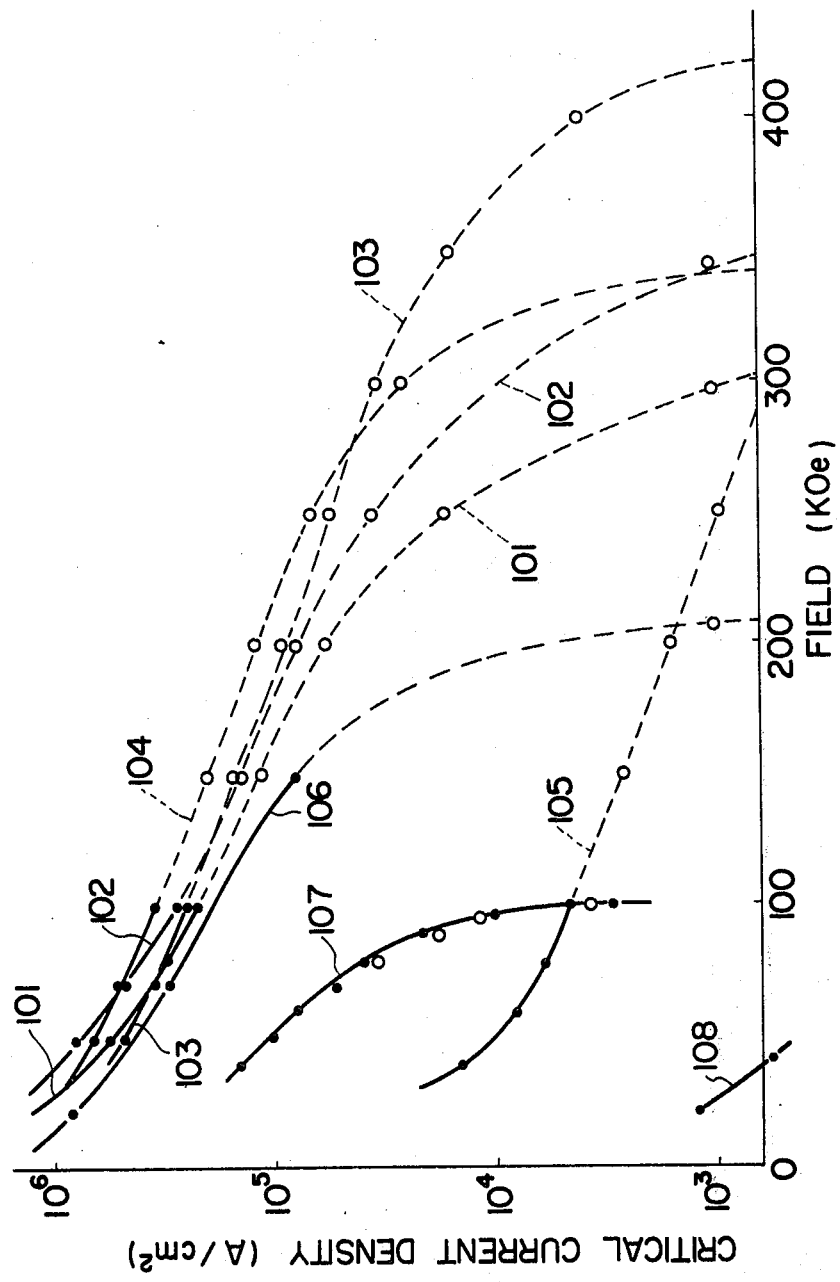

SUPERCONDUCTIVE ELEMENTS AND METHOD FOR PRODUCING THE SAME

BACKGROUND OF THE INVENTION

1. Field of the Invention

This invention relates to a superconductive element having a superconductive layer of a compound of a crystal structure of $\beta$-W system (A-15 system) which is useful for superconductive devices, especially a cryotron, a superconductive switch and a superconductive memory. The invention relates also to a method for producing such superconductive element.

2. Brief Description of the Prior Art

A crystal structure of $\beta$-W system is frequently observed in intermetallic compounds comprising a transition metal of a high melting point and a metal element of a low melting point, and many of these compounds having the $\beta$-W crystal structure exhibit superconductivity and have a high superconductive critical temperature and a high critical current density even in a high magnetic field. As such superconductive material, there have been known binary intermetallic compounds of the $\beta$-W crystal system such as $V_3Ga$, $V_3Si$, $Nb_3Sn$, $Nb_3Al$ and $Nb_3Ga$, and ternary intermetallic compound of the $\beta$-W crystal system such as $Nb_3(Al,Ge)$ and $Nb_3(Ga,Al)$.

The critical magnetic field at the liquid helium temperature (4.2°K) is about 200 KG in the case of $V_3Ga$, about 250 KG in the case of $V_3Si$ and $Nb_3Sn$, about 295 KG in the case of $Nb_3Al$, about 342 KG in the case of $Nb_3Ga$, and about 420 KG in the case of $Nb_3(Al,Ge)$. In case a superconductive magnet generating a high magnetic field is prepared with use of such superconductive material, it is required to have not only a high critical magnetic field but also a high critical current density.

Compound type superconductors of conventional bulk materials have a very insufficient critical current density at 70 KG and in each case the critical current density at 70 KG is within a range of $10^3$ to $10^4$ A/cm². Even in the case of $Nb_3Al$, the critical current density at 70 KG is about $5 \times 10^3$ A/cm².

When a superconductive compound layer is formed according to the diffusion method employing a diffusion temperature not exceeding 1,200°C., each of the compounds $V_3Si$, $V_3Ga$ and $Nb_3Sn$ exhibits at 70 KG such an excellent critical current density that it exceeds $10^5$ A/cm². However, in the case of $V_3Si$, $V_3Ga$ and $Nb_3Sn$ the critical magnetic field is low and in about 200 to 250 KG at the liquid helium temperature, and it is not comparable to the critical magnetic field of $Nb_3Al$ or the like, that exceeds about 300 KG.

In the case of materials of the Nb-Al, Nb-Ga, Nb-Al-Ge and Nb-Ga-Al systems having a high critical magnetic field, however, in order to form a $\beta$-W crystal phase according to the diffusion method, the diffusion temperature should be heightened to 1,500° to 1,600°C. or higher. If the diffusion temperature is lower than the above level, in the case of a material comprising Nb and Al, a compound of a higher Al concentration such as $Nb_2Al$ or $NbAl_3$ is formed and in the case of a material comprising Nb and Ga, a compound of a higher Ga concentration such as $Nb_5Ga_3$ is formed. Thus, in order to form a layer of $Nb_3Al$ or the like by the diffusion method, it is necessary to employ a diffusion temperature exceeding 1,500° to 1,600°C. For this reason, in such cases a drastic reduction of the critical current density cannot be avoided.

In a compound type superconductive material, pinning points of magnetic fluxes reside in the grain boundary, and it is known that as the grain size is smaller, the number of pinning points increases and hence, the critical current density is heightened. The grain size of such compound is larger as the preparation temperature is higher. Accordingly, in order to increase the critical current density it is preferred that the preparation temperature is as low as possible.

In case a film material is prepared according to the CVD method, the method of the simultaneous spattering of each element or the method of the simultaneous vacuum deposition of each element, distances between different atoms scattered on a substrate are short, and therefore, it is expected that the diffusion temperature, i.e. the substrate temperature at the film preparation, can be made lower than the above-mentioned bulk diffusion temperature. In fact, it was reported that according to the CVD or spattering method, the temperature for preparation of $Nb_3(Al,Ge)$ can be made lower than 1,000°C. and the critical current density can be increased. In this case, however, the critical temperature is as low as 14°K or 10.7°K. If according to the remaining method, i.e., the method of the simultaneous vacuum deposition of each element, it is possible to increase the critical current density in materials of Nb-Al, Nb-Ga, Nb-Al-Ge and Nb-Ga-Al systems without lowering the critical temperature below that of the bulk aging material, it will be possible to prepare with use of these materials superconductive magnets capable of generating a higher magnetic field than that attainable in such materials as $Nb_3Sn$, $V_3Ga$ and $V_3Si$, for example, superconductive magnets capable of generating a magnetic field of more than 200 KG.

However, as detailed hereinbelow, if a conventional substrate is employed, only a superconductive film of a relatively low critical current density and a relatively low critical temperature is obtained.

As a substrate for a superconductive film of a $\beta$-W crystal system compound, there have heretofore been used such insulating materials as molten quartz and such metallic materials as Nb and W.

In a case a film of a $\beta$-W crystal system compound, for example, a Nb-Al film having a $\beta$-W crystal structure and a critical temperature approximating that of the bulk is prepared, it is necessary that the simultaneous vacuum evaporation should be conducted at a substrate temperature exceeding 800°C., or that after the simultaneous vacuum evaporation is conducted at a substrate temperature approximating room temperature, the vacuum heat treatment should be conducted at about 1,000°C. Also, in the case of a superconductive layer of the Nb-Al-M ternary system in which a part of Al in Nb-Al is replaced by other metal, and in the case of a superconductive film of the Nb-Ga or Nb-Sn binary or ternary system, the preparation temperature should be made higher than about 800° to about 900°C.

Fused quartz can be used at a temperature as high as 1,100° to 1,200°C., but in some film-constituting elements, it reacts with the film at lower temperatures, with the result that it is made difficult to form a compound of the $\beta$-W crystal system. For instance, in the case of a Nb-Al film, if the Nb : Al atomic ratio is less than 3 : 1 and the temperature is higher than about 900°C., the reaction between Al and a quartz substrate is so vigorous that both the critical temperature and the critical current density are lowered. Further, in case fused quartz is employed as a substrate, when the preparation temperature exceeding 900°C. is lowered to room temperature by cooling, because of the difference of the thermal expansion coefficient between fused quartz ($0.35 \times 10^{-6}$/°C. at room temperature) and the film ($8 \times 10^{-6}$/°C. at room temperature in the case of $Nb_3Al$,) cracks are readily formed and in extreme case the film is peeled from the substrate.

In case a heat-resistant metal such as Nb and W is employed as a substrate, it is possible to use such substrate at a temperature of up to about 2,000°C. Accordingly, the substrate can resist the preparation temperature of about 1,000°C. However, when the $\beta$-W crystal structure of the film is unstable, the substrate reacts with film-constituting elements. For instance, when a film of the Nb-Al-Cu system formed on a Ta substrate by simultaneous vacuum deposition is subjected to the vacuum heat treatment at 900°C., the $\beta$-W system compound is decomposed and an alloy of Nb and Ta is formed. Further, since the above substrate metal has a better conductivity at low temperatures than the prepared film, electric insulation cannot be attained between the film and substrate and therefore, it is difficult to determine the electric characteristics of the film. Further, in case a metallic material is used as a substrate, as in the case of fused quartz, because of the difference of the thermal expansion coefficient between the superconductive film and the substrate, formation of cracks in the film cannot be avoided, and therefore, use of such substrate is not preferred.

The above explanation has been made mainly with reference to the Nb-Al film, but the same holds true in the case of the superconductive films of the Nb-Ga, Nb-Al-Ge and Nb-Ga-Al system compounds.

As described hereinabove, superconductive elements according to the conventional techniques exhibit only an insufficient critical current density in either a low magnetic field or a high magnetic field or both of these fields, and in some cases, cracks are formed in the films or film peeling is observed.

SUMMARY OF THE INVENTION

It is a primary object of this invention to provide a superconductive element which has sufficiently high critical temperature, critical magnetic field and critical current density and which exhibits stable and excellent characteristics without formation of cracks, by selecting and employing, as a substrate for a superconductive film of a $\beta$-W crystal system compound such as $Nb_3Al$, $Nb_3Ga$, $Nb_3(Al,Ge)$ and $Nb_3(Ga,Al)$, a material which is stable at high temperatures and does not react with a vacuum deposited film of the above compound type superconductive material and does not form cracks or peelings in the vacuum deposited film. Another object of this invention is to provide a method for producing such a superconductive element.

The above objects of this invention can be attained by employing as the substrate material (1) alumina that has a thermal expansion coefficient of $8 \times 10^{-6}$/°C which is almost equal to the thermal expansion coefficient of the $\beta$-W crystal system compound and does not react with a vacuum deposited film of the $\beta$-W crystal system compound at a temperature of 800° to 1,500°C. or (2) a plate of a high-melting-point metal having a thermal expansion coefficient approximating that of alumina, such as Mo ($8 \times 10^{-6}$/°C.), Nb ($9 \times 10^{-6}$/°C.), Ta ($8 \times 10^{-6}$/°C.), W ($5.9 \times 10^{-6}$/°C.), stainless steel or super alloys, on the surface of which a film of alumina is deposited. The deposition of an alumina film on such metal plate is performed preferably by the vacuum deposition method, especially the vacuum deposition method using an electron gun.

As the material to be used for formation of a vacuum deposition film, there are used compound type superconductive materials of $Nb_3Al$, $Nb_3Ga$, $Nb_3(Al,Ge)$ and $Nb_3(Ga,Al)$ systems. It is desired that the vacuum deposition is conducted at a substrate temperature of 850° to 1,200°C. in the case of the $Nb_3(Al,Ge)$ system compound and at a substrate temperature of 800° to 1,200°C. in the case of compounds of the other three systems. If the substrate temperature is outside the above range, a sufficient critical current density cannot be obtained. In the case of Nb-Al and Nb-Al-Ge systems, it is preferred that the Nb concentration in the vacuum deposition film is within a range of from about 70 to about 80 at. %, and in the case of Nb-Ga and Nb-Ga-Al systems, it is preferred that the Nb concentration in the vacuum deposition film is within a range of from about 70 to about 83 at. %. In the case of ternary systems, it is desired that less than one-half of the aluminum in the binary system composition is replaced by Ge or less than one-half of Ga in the binary system composition is replaced by aluminum. If the composition of the vacuum deposited film is outside the above range, a high critical temperature cannot be obtained.

Further, the above-mentioned superconductive material to be used in this invention can be expressed by the following general formulae:

$$Nb_j(Al_{1-x}Ge_x) \text{ and } Nb_k(Ga_{1-x}Al_x)$$

in which $j$ is within a range of from 2.3 to 4.0, $k$ is within a range of from 2.3 to 4.9 and $x$ is within a range of from 0 to 0.5.

It may be considered that heat-resistant oxides such as beryllia, zirconia, magnesia, titania and mixtures thereof will probably be used as substrates in addition to the above-mentioned alumina. However, since the thermal expansion coefficient of the above oxides other than alumina is different to some extent from that of the $\beta$-W system compound, such good results as attainable in the case of alumina cannot be expected when such oxides are employed.

The superconductive element of this invention having the above-mentioned structure exhibits a high critical current density in either a low magnetic field or a high magnetic field. Further, in the superconductive element of this invention, neither cracking nor peeling is formed or caused.

The critical temperature of the superconductive element of this invention having the above-mentioned structure can be further heightened by subjecting it to the heat treatment at about 600° to about 800°C. for at least about 30 minutes.

BRIEF DESCRIPTION OF THE DRAWINGS

FIG. 8 shows curves illustrating the relation between the intensity of the outer magnetic field and the critical current density in various superconductive elements.

DESCRIPTION OF THE PREFERRED EMBODIMENTS

This invention will be more apparent from Examples given below and a Comparative Example showing difficulties involved in the conventional techniques.

EXAMPLE 1

Figure 1:
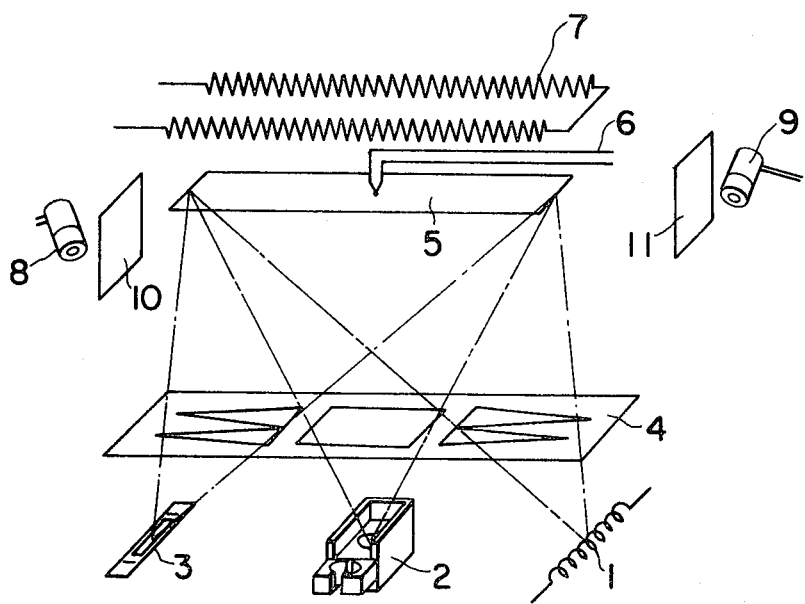
FIG. 1 is a diagram illustrating the arrangement (in a bell jar) of a vacuum deposition apparatus used in the hereinafter described Examples of the method of this invention.

This Example illustrates an embodiment in which a compound type superconductive material of the Nb-Al system is used as a superconductive material. % Rh FIG. 1 is a diagram illustrating the arrangement of the unit for vacumm deposition of a superconductive film employed in this Example. As evaporators for the constituent elemnts, there were employed an electron gun 2 for Nb and a W-coil(tungsten coil) 1 for Al(the aluminum source is not shown). As the substrate 5, an alumina plate was used. The temperature of the substrate was measured by a Pt-Pt. 13% Rh thermocouple 6 placed above the substrate in a position having contact with the substrate. A substrate-heating heater 7 was used as that was capable of heating the substrate to 1,300°C. In order to obtain a sample differing in the Al atom concentration by one vacuum deposition operation, the W-coil 1 was disposed vertically to the longitudinal direction of the substrate 5. A shielding plate 4 having windows of a form of a plurality (two in the drawing) of parallelly and equidistantly aligned equilateral triangles of a short base or isosceles trapezoids and a window of a rectangular form is disposed between the substrate 5 and the evaporation sources 1 and 2 in parallel to the substrate 5. By employing the vacuum deposition unit of the above arrangement, it was made possible to obtain a film in which the Nb atomic concentration was constant and the Al atom concentration changed with a fixed gradient. The evaporation rate of Nb was controlled to a certain level by keeping the emission current of the electron gun constant and the evaporation rate of Al was kept constant by means of a quartz oscillator 9. A shielding plate 11 was disposed to prevent atoms other than aluminum from flying to the quartz oscillator 9. The degree of vacuum was less than $5 \times 10^{-6}$ Torr just before the vacuum deposition, but at the vacuum deposition the pressure was raised to $1 \times 10^{-5}$ to $3 \times 10^{-5}$ Torr because of the presence of gases released from evaporation sources 1 and 2. The evaporation rate of Nb was controlled to about 25 A/sec. and that of Al was controlled to 4 to 10 A/sec. The vacuum deposition was conducted for 5 minutes, and the thickness of the resulting film was found to be about 1 $\mu$m as measured by a multiple beam interferometer.

Referential numerals 3, 8 and 10 indicate a W-boat (tungsten boat), a quartz oscillator and a shielding plate, respectively, each to be used for the vacuum deposition of a compound containing Ge or Ga placed in the boat that is heated by electric current.

Figure 2:
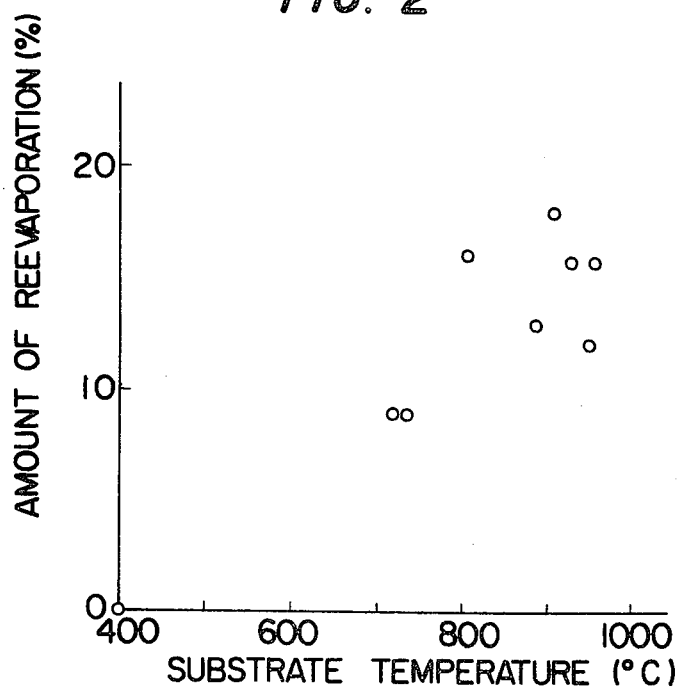
FIG. 2 is a graph illustrating the relation between the substrate temperature during the vacuum deposition step and the amount of Nb re-evaporated.

It is considered that since the vacuum deposition was conducted at a high temperature in this Example, vacuum deposited atoms were re-evaporated. When the vacuum deposition of Nb was conducted at 400°C. as a standard substrate temperature and at higher substrate temperatures, the amount of re-evaporated Nb in the Nb film was calculated from the standard film thickness obtained by the vacumm deposition conducted at 400°C. Results are shown in FIG. 2. From the results, it is seen that 15 to 20% of Nb was re-evaporated at substrate temperatures of 900° to 1,100°C. When Al or Ge was vacuum deposited simultaneously with Nb, no re-evaporation was observed within a tested temperature range, but in the case of Ga about 30% of deposited Ga was re-evaporated at substrate temperatures exceeding 1,100°C.

Figure 3:
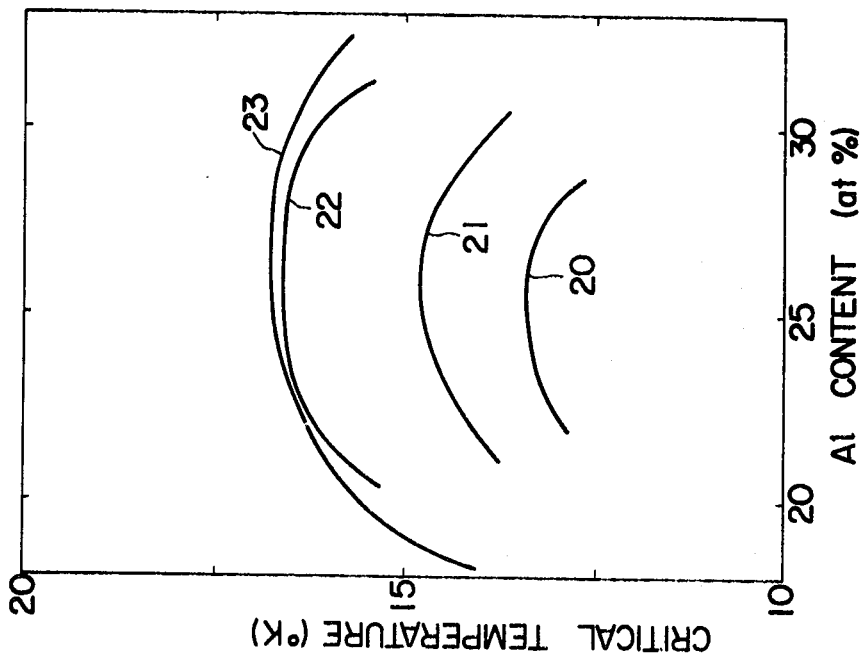
FIG. 3 shows curves illustrating the relation between the aluminum concentration in a Nb-Al film and the critical temperature, obtained when the substrate temperature at the vacuum deposition step is used as a parameter.

While the foregoing experimental results were taken into consideration, a Nb-Al film was formed on an alumina plate by conducting the simultaneous vacuum deposition by changing the substrate temperature, with the substrates being sequentially heated and the composition of the superconductive materials being determined by a microanalyzer. Results are shown in FIG. 3 illustrating the relation between the aluminum concentration in Nb-Al film and the critical temperature, obtained when the substrate temperature at the vacuum deposition step was employed as a parameter. From FIG. 3 it is seen that elevation of the substrate temperature at the vacuum deposition step results in increase of the critical temperature.

The maximum critical temperatures of Nb-Al films deposited at substrate temperatures of 850°C. (curve 20), 900°C. (curve 21), 1,000°C. (curve 22) and 1,100°C. (curve 23) were 13.5°K, 15°K, 16.7°K and 16.8°K, respectively. As is seen from these results, at a substrate temperature of up to 1,000°C., the critical temperature increases with elevation of the substrate temperature at the vacuum deposition step, but at a substrate temperature exceeding 1,000°C. the critical temperature tends to be saturated and no more particular of significant increase is observed. It is seen that the elevation of the substrate temperature at the vacuum deposition step results in broadening of the compositional critical temperature. It is also seen that the Al concentration in Nb-Al film at which a high critical temperature is obtained when the vacuum deposition is conducted at a substrate temperature exceeding 1,000°C. is within a range of about 20 to about 30 at. %. In other words, a high critical temperature is obtained when the value $j$ of $Nb_jAl$ is within a range of from 2.3 to 4.0. If the Al content is outside this range, the critical temperature is drastically lowered.

The reason why elevation of the substrate temperature at the vacuum deposition step tends to result in increase of the critical temperature is considered to be that at a higher substrate temperature formation of $Nb_2Al$ or $NbAl_3$ which has bad influences on the superconductive characteristics is reduced.

Figure 4:
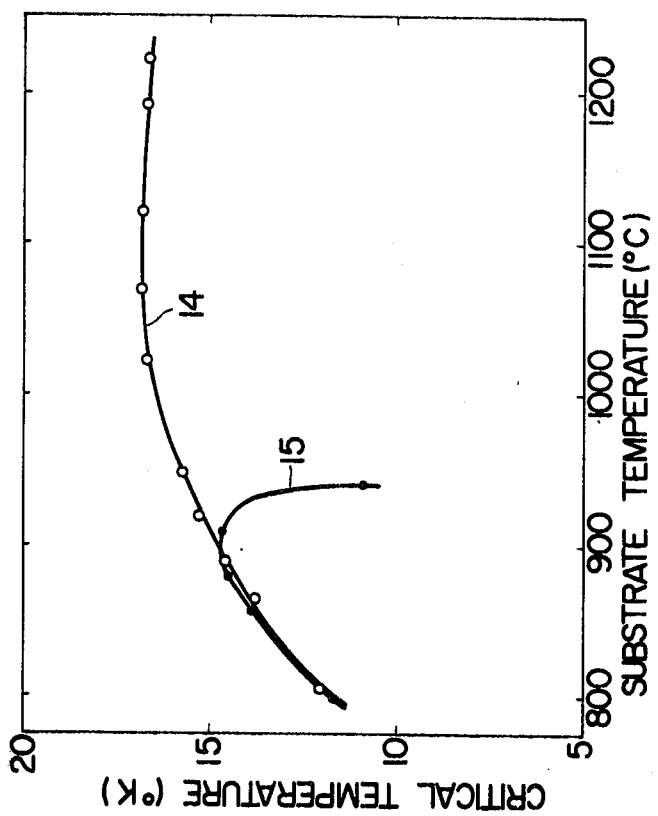
FIG. 4 shows curves illustrating the relation between the substrate temperature at the vacuum deposition of a Nb-Al film and the critical temperature.

Curve 14 of FIG. 4 illustrates the relation between the substrate temperature at the vacuum deposition step and the critical temperature of the resulting Nb-Al film, obtained with reference to a Nb-Al film containing about 25 at. % of aluminum. Curve 15 of FIG. 4 illustrates a similar relation obtained by employing quartz as a substrate, which will be described in detail in the Comparative Example given hereinafter.

As is seen from results shown in FIG. 4, when alumina is employed as a substrate, the critical temperature is gradually increased as the substrate temperature at the vacuum deposition step is elevated and when the substrate temperature exceeds 1,000°C., the critical temperature is maintained substantially at a constant level and the reduction of the critical temperature which is observed in the case of the quartz substrate is not caused to occur. It is considered that even when the substrate temperature is elevated, the alumina substrate, unlike the quartz substrate, does not react with the vacuum deposited film and therefore, the reduction of the critical temperature is not caused to occur.

Figure 5:
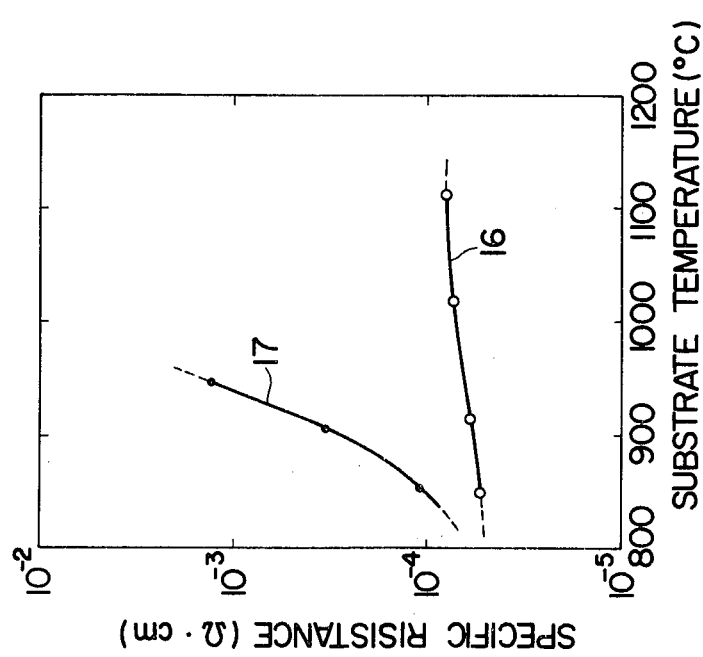
FIG. 5 shows curves illustrating the relation between the substrate temperature at the vacuum deposition of a Nb-Al film and the specific resistance.

Curve 16 of FIG. 5 illustrates the relation between the alumina substrate temperature at the vacuum deposition step and the specific resistance at about 20°K of the resulting Nb-Al film, obtained with reference to a Nb-Al film containing about 25 at. % of Al. From this curve it is seen that the specific resistance is hardly changed even if the substrate temperature is elevated, which supports the premise that no reaction is caused to occur between the substrate and the deposited film. Curve 17 of FIG. 5 illustrates a similar relation obtained by employing quartz as a substrate, which also will be described in detail in the Comparative Example given hereinafter.

The relation between the thickness of a Nb-Al film containing about 25 at. % of Al and the transition width (the temperature difference, observed when the temperature is lowered, between the temperature at which the resistance begins to decrease and the temperature at which the completely superconductive state is attained) was examined. As a result, it was found that in the case of films having a thickness exceeding 0.3 μm, the transition width was nearly constant and was within a range of from 0.5 to 1.0°K, and that in the deposited film neither cracking nor peeling was observed. From this it will be readily understood that when an alumina substrate is employed, an increase of the film thickness gives no bad influences to the superconductive characteristics. This is considered to be due to the fact that there is no substantial difference in the thermal expansion coefficient between the alumina substrate and $Nb_3Al$ film.

Figure 6:
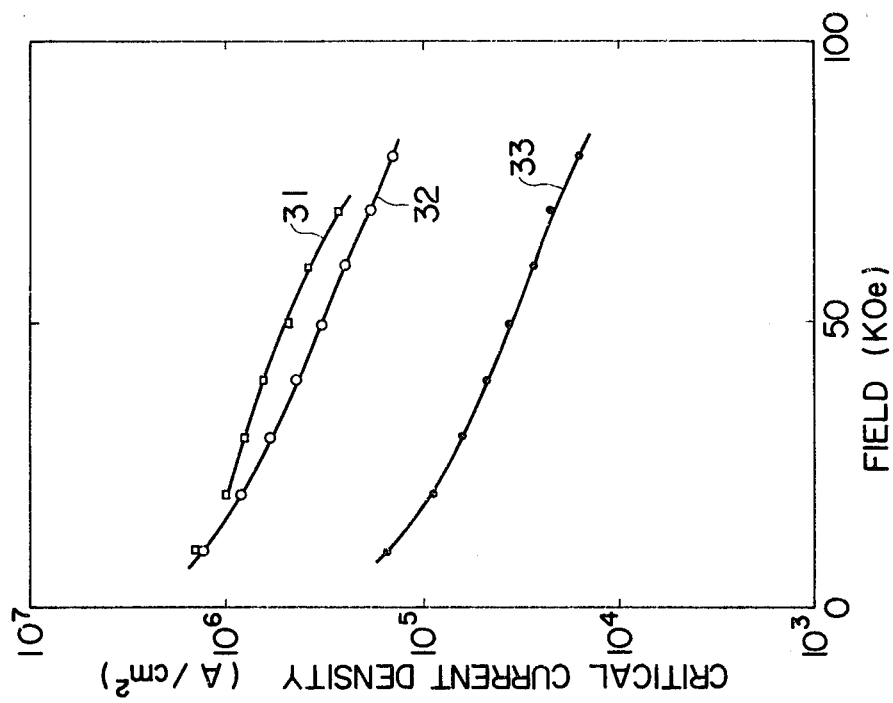
FIG. 6 shows curves illustrating the relation between the intensity of the outer magnetic field and the critical current density of a Nb-Al film, obtained when the substrate temperature at the vacuum deposition step is used as a parameter.

FIG. 6 illustrates the relation between the intensity of the outer magnetic field and the critical current density observed with respect to typical samples obtained by conducting the vacuum deposition at a substrate temperature of 900°C. (curve 31), 1,000°C. (curve 32) or 1,100°C. (curve 33).

Figure 7:
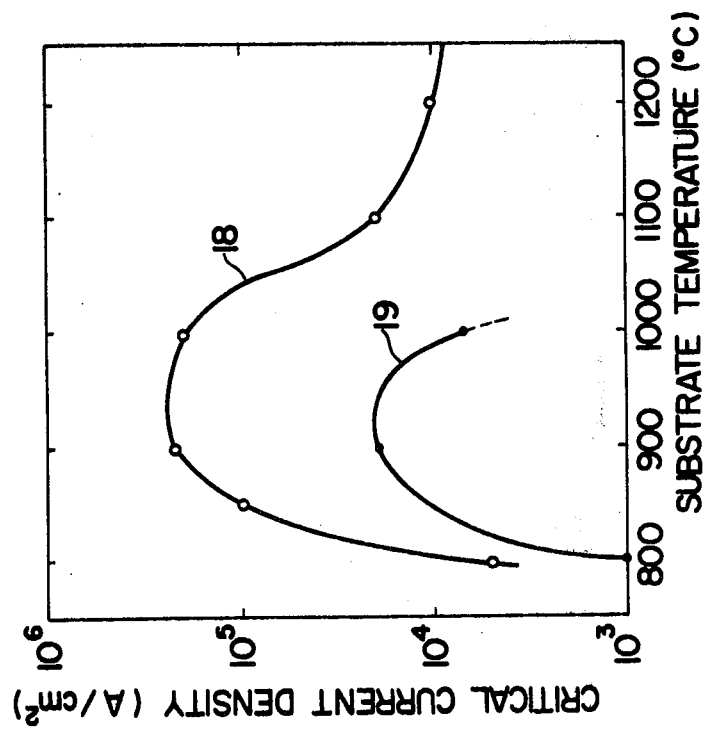
FIG. 7 shows curves illustrating the relation between the substrate temperature at the vacuum deposition of a Nb-Al film and the critical current density at 80 KOe.

Curve 18 of FIG. 7 illustrates the relation between the alumina substrate temperature at the vacuum deposition step and the critical current density at 80 KOe, obtained with reference to a Nb-Al film containing about 25 at. % of Al. From this curve, it is seen that the maximum value of the critical current density is about $2.2 \times 10^5$ A/cm$^2$, which is fully sufficient from the practical viewpoint.

Curve 19 of FIG. 7 illustrates a similar relation obtained by employing quartz as a substrate, which will be described in detail in the Comparative Example given hereinafter.

In case alumina is employed as a substrate as in this Example, even when the substrate temperature at the vacuum deposition step exceeds 900°C., the reduction of the critical current density as observed in the case of the quartz substrate is not caused to occur. However, if the substrate temperature is further elevated, the grain size of the deposited compound becomes coarse and therefore, the critical current density is reduced.

Needless to say, a higher critical current density and a higher critical temperature are more desired, and practically applicable lower limits of the critical current density and critical temperature are said to be $10^4$ A/cm$^2$ and 12°K, respectively. Accordingly, in view of the above experimental results, it is seen that in order to obtain an excellent Nb-Al system compound type superconductive film according to the method of this invention, it is necessary to maintain an alumina substrate temperature at the vacuum deposition step within a range of from about 800° to about 1,200°C.

Curve 101 of FIG. 8 illustrates the relation between the intensity of the magnetic field and the critical current density in a superconductive element having a Nb-Al film formed in this Example. FIG. 8 also illustrates, for comparison, similar relations obtained with respect to bulk materials of $Nb_3(Al_{0.8}Ge_{0.2})$ and $Nb_3Ga$ prepared by plasma melting $Nb_3Sn$ film prepared by the diffusion method and a typical instance of the alloy type superconductive material, 35% Nb-60%Ti-5%Zr. More specifically, in FIG. 8, curve 101 illustrates the relation obtained in this Example, and curves 102, 103 and 104 illustrate the relations obtained in Examples 2, 3 and 4, respectively, each being described in detail hereinafter. Curves 105 and 106 illustrate the relations obtained with respect to the bulk material of $Nb_3(Al_{0.8}Ge_{0.2})$ and the layer of $Nb_3Sn$ formed by the diffusion method, respectively. Curves 107 and 108 illustrate the relations obtained with respect to 35% Nb-60%Ti-5%Zr and the bulk material of $Nb_3Ga$, respectively. In these curves solid points indicate values actually obtained by the measurement and hollow points indicate estimate values. The reason why estimate values were employed is that a magnetic field of an intensity higher than 150 KOe could not be obtained. The estimate values were obtained by the following procedures.

Kim et al teach (Phys. Rev., 139, p. 1163) that the relation between the intensity H of the outer magnetic field and the critical current density Jc is expressed by the following equation:

$$\alpha_L = (H + Ho) \cdot Jc \tag{1}$$

wherein $\alpha_L$ indicates the Lorentz force and $Ho$ designates the intensity of the self-magnetization. This equation (1) holds good in the case of a low magnetic field (lower than scores of KG), but in the case of a magnetic field having an intensity approximating that of the superconductive material $Hc$, this equation (1) does not comply with the actual magnetic field-critical current density curve. Therefore, a correction term $Jo$ is introduced into the above equation (1) when $H$ is nearly equal to $Hc$, and the following equation is obtained:

$$\alpha_L = (H + Ho) \cdot (Jc + Jo) \tag{2}$$

When the condition that $Jc$ is equal to 0 if $H$ is equal to $Hc$ is introduced into the above formula (2), the following equation is derived:

$$\alpha_L = \frac{Hc + Ho}{Hc - H} (H + Ho) Jc \tag{3}$$

The estimate values were calculated based on equation (3). In curve 107 of FIG. 8 both the found values and estimate values calculated based on the equation (3) are shown, and it is seen that both values conform quite well to each other. Therefore, it is construed that this equation (3) holds good.

The $Ho$ and $\alpha_L$ values of each superconductive material shown in FIG. 8 are given in Table 1.

Table 1

| Material | Ho (KG) | $\alpha_L$(KG.A/cm$^2$) |
| --- | --- | --- |
| $Nb_3Al$ film (obtained in this Example) | 23.2 | $4.58 \times 10^7$ |
| $Nb_3Ga$ film (obtained in Example 2) | −19.2 | $2.83 \times 10^7$ |
| $Nb_3(Al_{0.75}Ge_{0.25})$ film (obtained in Example 3) | 5.3 | $3.50 \times 10^7$ |
| $Nb_3(Ga_{0.8}Al_{0.2})$ film (obtained in Example 4) | 40.8 | $7.80 \times 10^7$ |
| $Nb_3(Al_{0.8}Ge_{0.2})$ bulk | −1.3 | $5.81 \times 10^5$ |
| $Nb_3Sn$ film | 73.1 | $7.47 \times 10^7$ |
| 35% Nb-60%Ti-5%Zr | 64.2 | $3.88 \times 10^4$ |
| $Nb_3Ga$ bulk | −5.8 | $2.09 \times 10^4$ |

As is apparent from FIG. 8, a superconductive element having a $Nb_3Al$ film, obtained in this Example, has an excellent critical current density in either a low magnetic field or a high magnetic field. In contrast, superconductive elements according to the conventional techniques have an insufficient critical current density in a low magnetic field or a high magnetic field, or both of them. Thus, from the results shown in FIG. 8, it will readily be understood that the superconductive element of this invention is much superior to those obtained according to the conventional techniques.

COMPARATIVE EXAMPLE

This Comparative Example illustrates a comparative embodiment in which fused quartz is employed as a substrate for forming a superconductive film of the Nb-Al system compound.

The same vacuum deposition unit and conditions as employed in Example 1 were employed in this Comparative Example.

Curve 15 of FIG. 4 illustrates the relation between the quartz substrate temperature at the vacuum deposition step and the critical temperature of the resulting Nb-Al film, obtained with respect to a Nb-Al film containing about 25 at. % of Al. As is seen from this curve, when quartz is employed as a substrate, although the critical temperature is increased as the substrate temperature at the vacuum deposition step is elevated up to 900°C., the critical temperature is lowered in the film formed at a higher substrate temperature. This is considered to be due to the fact that at a substrate temperature exceeding 900°C., reaction is caused to occur between the substrate and vacuum deposited film.

Curve 17 of FIG. 5 illustrates the relation between the quartz substrate temperature at the vacuum deposition step and the specific resistance of the resulting $Nb_3Al$ film at about 20°K. From this curve, it is seen that the specific resistance of the vacuum deposited film increases greatly with elevation of the substrate temperature, which is considered to be due to the fact that reaction is caused to occur between the quartz substrate and the vacuum deposited film at high temperatures.

When the relation between the thickness of the vacuum deposited film and the transition width was examined, it was found that with increase of the film thickness the transition width increased, and the transition width of 2°K at a film thickness of 0.5 $\mu$m became 5°K at a film thickness of 1 $\mu$m. Further, at a film thickness of 0.3 $\mu$m or greater, peeling of the vacuum deposited film was observed. It is considered that such phenomenon is caused by the difference of the thermal expansion coefficient between the quartz substrate and the $Nb_3Al$ film.

Curve 19 of FIG. 7 illustrates the relation between the quartz substrate temperature at the vacuum deposition step and the critical current density of the resulting Nb₃Al film at 80 KOe, and from this curve it is seen that the maximum value of the critical current density is about $2.1 \times 10^4$ A/cm², which is about one tenth of the maximum value obtained in the superconductive element of this invention prepared in foregoing Example 1, and such a low value for the critical current density is insufficient from the practical viewpoint. Further, when the quartz substrate temperature exceeds 900°C., the critical current density is lowered, and this reduction is considered to be due to the reaction between the substrate and the deposited film.

As is seen from the foregoing experimental results, the Nb₃Al layer vacuum deposited on a fused quartz substrate has fatal defects such as a low critical current density and drastical reduction of the critical temperature at a substrate temperature used for preparing the film exceeding about 900°C. It is further defective in that it is readily peeled off from the quartz substrate. Therefore, satisfactory results cannot be expected when a superconductive element is prepared from a Nb₃Al layer deposited on a quartz substrate.

EXAMPLE 2

This Example illustrates an embodiment in which a superconductive film of the Nb-Ga system compound is employed as a superconductive material.

The W boat 3, quartz oscillator 8 and shielding plate 10 shown in FIG. 1 were employed for evaporation of Ga and for controlling the evaporation rate. In this Example, none of the W-coil 1, quartz oscillator 9 and shielding plate 11 were employed. In the same manner as described in Example 1, by means of the shielding plate 4 there was obtained a film in which the Nb content was constant and the Ga content was varied with a fixed gradient. The Nb evaporation rate was controlled to about 25 A/sec and the Ga evaporation rate was controlled to 5 to 13 A/sec. Other preparation conditions were the same as described in Example 1. Thus, a Nb-Ga film was formed on an alumina plate by conducting the simultaneous vacuum deposition of Nb and Ga while changing the substrate temperature.

Figure 9:
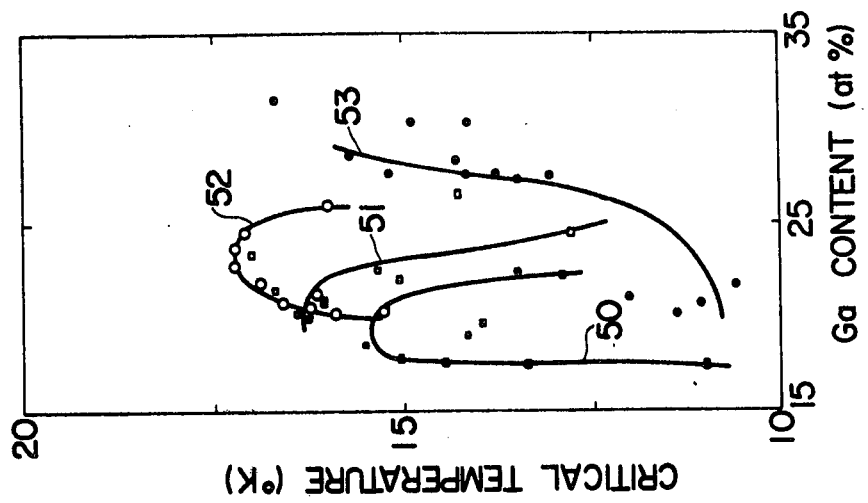
FIG. 9 shows curves illustrating the relation between the Ga concentration in a Nb-Ga film and the critical temperature, obtained when the substrate temperature at the vacuum deposition step is used as a parameter.
Figure 10:
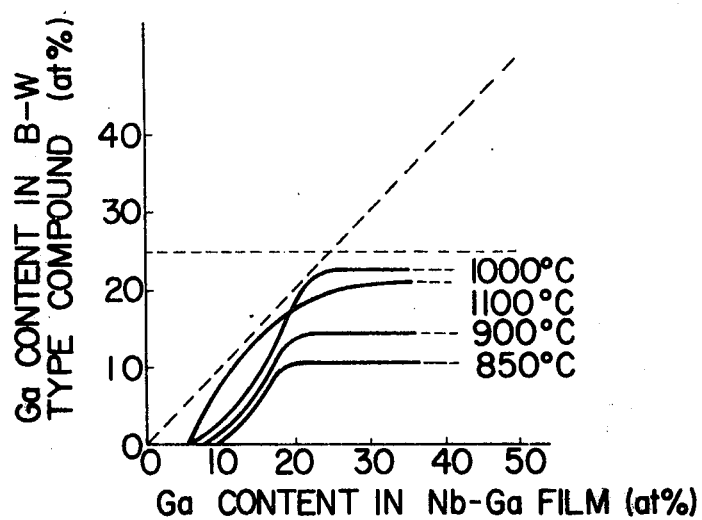
FIG. 10 shows diagrammatic curves illustrating the relation between the Ga concentration in a Nb-Ga film and the Ga concentration in the $\beta$-W compound phase, obtained when the substrate temperature at the vacuum deposition is used as a parameter.

FIG. 9 illustrates the relation between the Ga concentration in the Nb-Ga film and the critical temperature, obtained when the substrate temperature is employed as a parameter. From FIG. 9 it is apparent that when the substrate temperature is below 1,000°C., a higher substrate temperature results in a higher critical temperature. When the substrate temperatures at the vacuum deposition step are 850°C. (curve 50), 900°C. (curve 51), 1,000°C. (curve 52) and 1,100°C. (curve 53), Ga concentrations giving the maximum critical temperature are about 19 at. %, about 21 at. %, about 23 at. % and about 30 at. %, respectively. Though the maximum critical temperature-giving Ga content is thus varied to some extent depending on the substrate temperature, in general the Ga concentration of about 25 at. % gives a highest critical temperature in the superconductive film of the Nb-Ga system compound. The reason why the maximum critical temperature-giving Ga content is a little lower than about 25 at. % when the substrate temperature at the vacuum deposition step is 850°C. (curve 50) or 900°C. (curve 51) is that when the Ga content is higher than the maximum critical temperature-giving content, excessive Ga is not combined in lattices of the β-W system compound phase but forms Nb₅Ga₃. More specifically, if the substrate temperature at the vacuum deposition step is used as a parameter, such a relation as diagrammatically illustrated in FIG. 10 is established between the Ga concentration in the vacuum deposited film and the Ga concentration in the β-W system compound phase. In case the substrate temperature is 1100°C., a compound Nb₅Ga₃ is present at a Ga concentration exceeding 25 at. %, but the critical temperature is higher than in the sample of a lower Ga concentration. In conclusion, from the foregoing experimental results, it is apparent that a high critical temperature is obtained when the Ga content in the Nb-Ga film is within a range of from about 17 to about 30 at. %, namely when the value K in the formula Nb$_K$Ga is within a range of from 2.3 to 4.9. If the Ga concentration is outside the above range, the critical temperature is drastically lowered.

Figure 11:
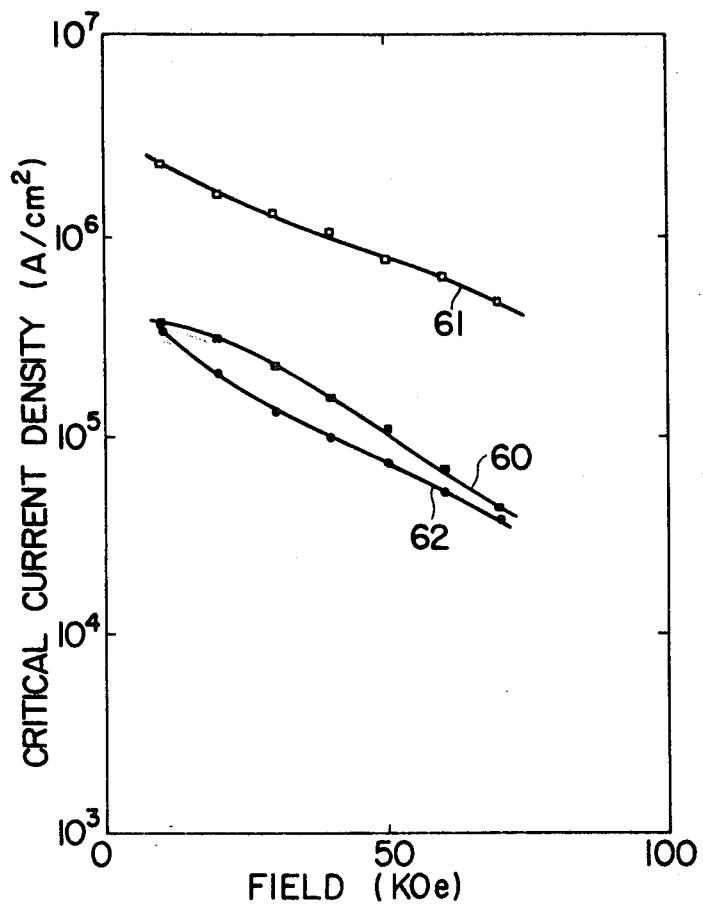
FIG. 11 shows curves illustrating the relation between the intensity of the outer magnetic field and the critical current density of a Nb-Ga film, obtained when the substrate temperature at the vacuum deposition step is used as a parameter.

FIG. 11 illustrates the relation between the intensity of the outer magnetic field and the critical current density, observed with respect to typical samples formed by conducting the simultaneous vacuum deposition of Nb and Ga at a substrate temperature of 850°C. (curve 60), 900°C. (curve 61) or 1,100°C. (curve 62).

Figure 12:
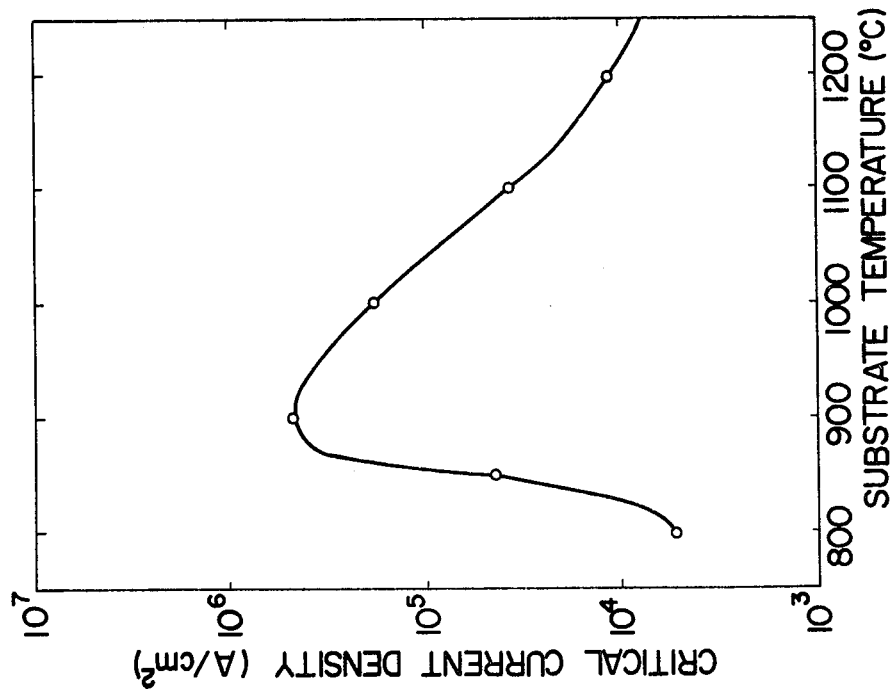
FIG. 12 shows a curve illustrating the relation between the substrate temperature at the vacuum deposition of a Nb-Ga film and the critical current density at 70 KOe.

FIG. 12 illustrates the relation between the alumina substrate temperature at the vacuum deposition step and the critical current density at 70 KOe in a Nb-Ga film containing about 25 at. % of Ga.

As is seen from FIG. 12, the critical current density is reduced at a substrate temperature used for preparing the film below 850°C., which is due to the fact that formation of the β-W system compound phase is difficult at such a low substrate temperature. The critical current density is also reduced at a substrate temperature used for preparing the film exceeding 1,000°C., which is due to the fact that the grain size is coarsened in the film at such a high substrate temperature. In order for a superconductive material to be practically useful, it should have a critical termperature of at least 12°K and a critical current density of at least $10^4$ A/cm². In view of the foregoing, in the case of the Nb-Ga film, the substrate temperature at the vacuum deposition step should be within a range of from about 800° to about 1,200°C. A maximum critical current density is obtained when the substrate temperature at the vacuum deposition step is about 900°C.

In superconductive films obtained in this Example, neither cracking nor peeling was observed.

With respect to a superconductive element having a Nb-Ga film of a Ga content of about 25 at. % obtained in this Example, the intensity of the magnetic field and the critical current density were plotted in the same manner as in Example 1 to obtain curve 102 of FIG. 8, from which it is seen that this superconductive element is much superior to those prepared according to the conventional techniques.

EXAMPLE 3

This Example illustrates an embodiment in which a superconductive film of the Nb-Al-Ge system compound is used as a superconductive material.

The W-coil 1, quartz oscillator 9 and shielding plate 11 of the vacuum deposition unit shown in FIG. 1 were used for evaporation of Al and control of the Al evaporation rate, and the W boat 3, quartz oscillator 8 and shielding plate 10 were employed for evaporation of Ge and control of the Ge evaporation rate. In the same manner as in Example 1, by means of the shielding plate 4 there was obtained a film in which the Nb content was constant and the Al and Ge contents were changed with a fixed gradient. The evaporation rate of Nb was controlled to about 25 A/sec, the evaporation rate of Al was controlled to less than, (i.e. up to) 8 A/sec, and the evaporation rate of Ge was controlled to less than 11 A/sec. Other preparation conditions were the same as in Example 1. Thus, a Nb-Al-Ge film was formed on an alumina plate by conducting the simultaneous vacuum deposition of Nb, Al and Ge while changing the substrate temperature. The Nb concentration was maintained at 75 to 76 at. %, and each of the Al and Ge concentrations was changed within a range of from 0 to 25 at. %.

Figure 13:
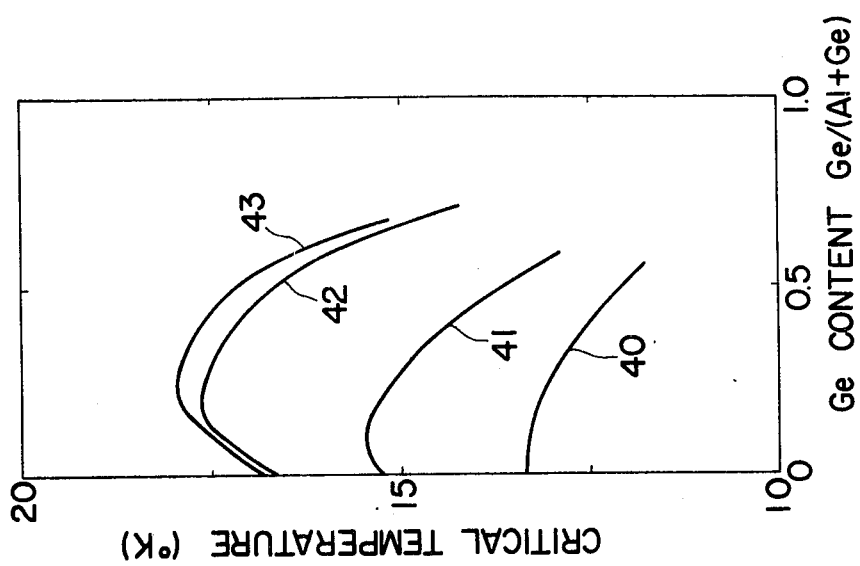
FIG. 13 shows curves illustrating the relation between the Ge concentration in a Nb-Al-Ge film and the critical temperature, obtained when the substrate temperature at the vacuum deposition step is used as a parameter.

FIG. 13 illustrates the relation between the Ge concentration in the Nb-Al-Ge film and the critical temperature, obtained when the substrate temperature at the vacuum deposition step is used as a parameter. As is seen from FIG. 13, a higher substrate temperature at the vacuum deposition step results in a higher critical temperature. In FIG. 13 there are shown results obtained when the vacuum deposition was conducted at substrate temperatures of 850°C. (curve 40), 900°C. (curve 41), 1,000°C. (curve 42) and 1,100°C. (curve 43). It was found that at a substrate temperature higher than 900°C., a high critical temperature was obtained when the Ge content in the vacuum deposited film was about 5 at. %, namely when the Ge/(Al + Ge) ratio was about 0.2. From the results shown in FIG. 13 it will be seen that the effect of substitution of a part of Al by Ge in the Nb-Al system compound type superconductive film is obtainable when less than about one-half of Al is substituted by Ge, namely when the value $x$ in the formula $Nb_j(Al_{1-x}Ge_x)$ is less than 0.5.

Figure 14:
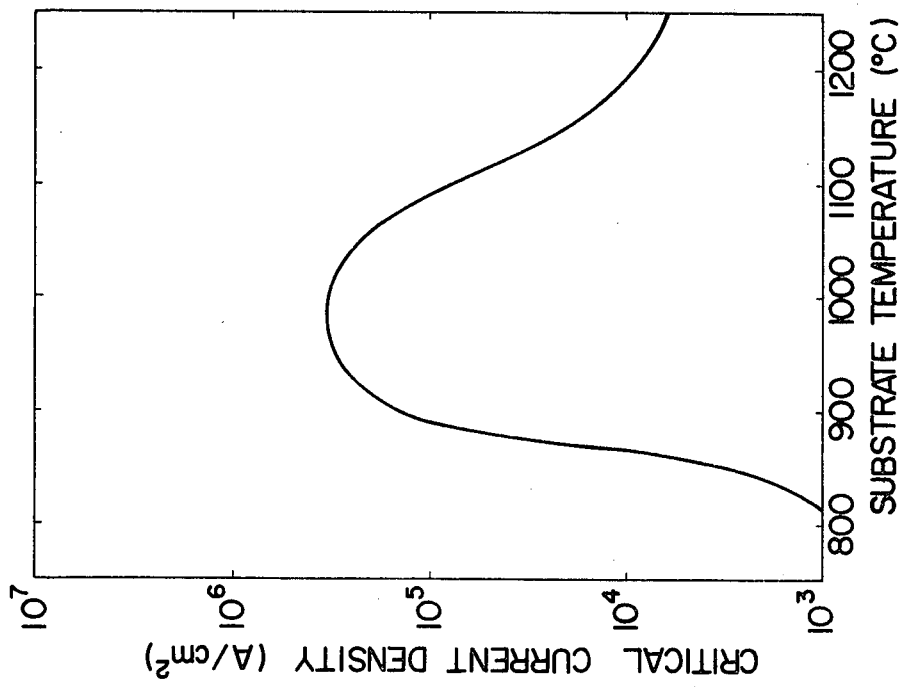
FIG. 14 shows a curve illustrating the relation between the substrate temperature at the vacuum deposition of a Nb-Al-Ge film and the critical current density at 70 KOe.

FIG. 14 illustrates the relation between the alumina substrate temperature at the vacuum deposition step and the critical current density at 70 KOe, obtained with respect to a Nb-Al-Ge film having a composition of $Nb_3(Al_{0.8}Ge_{0.2})$. From FIG. 14 it is seen that the critical current density is lowered at a substrate temperature used for preparing the film below 900°C., which is due to the fact that formation of the β-W system compound phase is difficult at such a low substrate temperature. It is also seen that the critical current density is lowered at a substrate temperature exceeding 1,000°C., which is due to the coarsening of the grain size in the film. In order to produce a superconductive material that is useful in practice, it should have a critical temperature of at least 12°K and a critical current density of at least $10^4$ A/cm$^2$. In view of the foregoing, in the case of the Nb-Al-Ge film, the vacuum deposition should be conducted at a substrate temperature ranging from about 850° to about 1,200°C.

Neither cracking nor peeling was observed in the superconductive films obtained in this Example.

With respect to a superconductive element having a Nb-Al-Ge film of a composition of $Nb_3(Al_{0.75}Ge_{0.25})$ obtained in this Example, the intensity of the magnetic field and the critical current density were plotted in the same manner as in Example 1 to obtain curve 103 shown in FIG. 8, from which it will readily be understood that the superconductive element obtained in this Example is much superior to those obtained according to the conventional techniques.

EXAMPLE 4

This Example illustrates an embodiment in which a superconductive film of the Nb-Ga-Al system compound is employed as a superconductive material.

The W boat 3, quartz oscillator 8 and shielding plate 10 of the vacuum deposition unit shown in FIG. 1 were employed for evaporation of Ga and control of the Ga evaporation rate. Other unit arrangement was the same as in Example 3. The Nb evaporation rate was controlled to about 25 A/sec, the Ga evaporation rate was controlled to less than 10 A/sec, and the Al evaporation rate was controlled to less than 8 A/sec. The vacuum deposition was conducted for 5 minutes, and the film thickness was found to be about 1 μm as measured by a multiple beam interferometer.

Under the above conditions, Nb, Ga and Al were simultaneously vacuum evaporated and deposited on an alumina substrate while changing the substrate temperature. The atomic concentration of the sum of Ga and Al was 19 to 20% in a sample vacuum deposited at a substrate temperature of 850°C., 21 to 22% in a sample vacuum deposited at a substrate temperature of 900°C., 23 to 25% in a sample vacuum deposited at a substrate temperature of 1,000°C., and 26 to 29% in a sample vacuum deposited at a substrate temperature of 1,100°C. In each sample, the balance was Nb.

Figure 15:
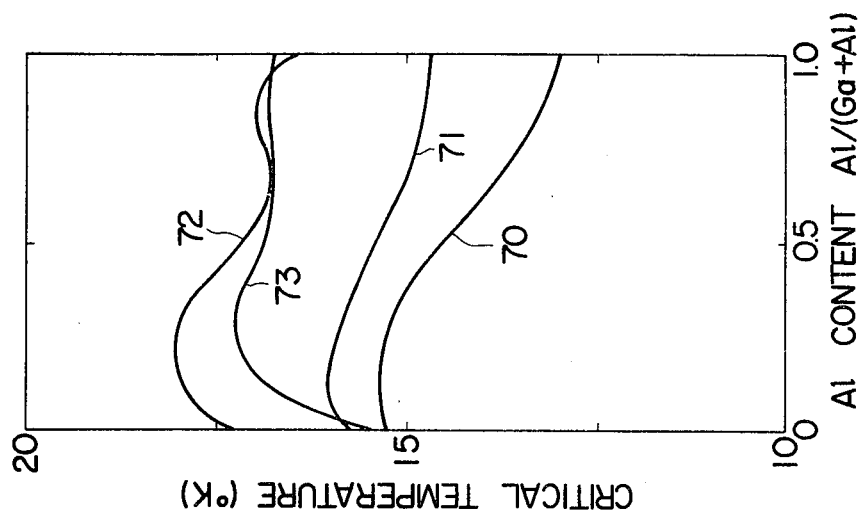
FIG. 15 shows curves illustrating the relation between the aluminum concentration in a Nb-Ga-Al film and the critical temperature, obtained when the substrate temperature at the vacuum deposition step is used as a parameter.

FIG. 15 illustrates the relation between the Al concentration in the Nb-Ga-Al film and the critical temperature, obtained when the substrate temperature at the vacuum deposition step is used as a parameter. From FIG. 15 it is seen that when the substrate temperature is up to 1,000°C., a higher substrate temperature at the vacuum deposition results in a higher critical temperature. In FIG. 15 there are shown results obtained when the vacuum deposition was conducted at the substrate temperatures of 850°C. (curve 70), 900°C. (curve 71), 1,000°C. (curve 72), and 1,100°C. (curve 73). A peak of the critical temperature is observed at a relatively low Al content. From the results shown in FIG. 15, it is seen that the improved effect of substitution of a part of Ga by Al in the superconductive film of the Nb-Ga system compound is obtainable when less than one-half of Ga is substituted by Al, namely when the value $x$ in the formula $Nb_K(Ga_{1-x}Al_x)$ is less than 0.5.

Figure 16:
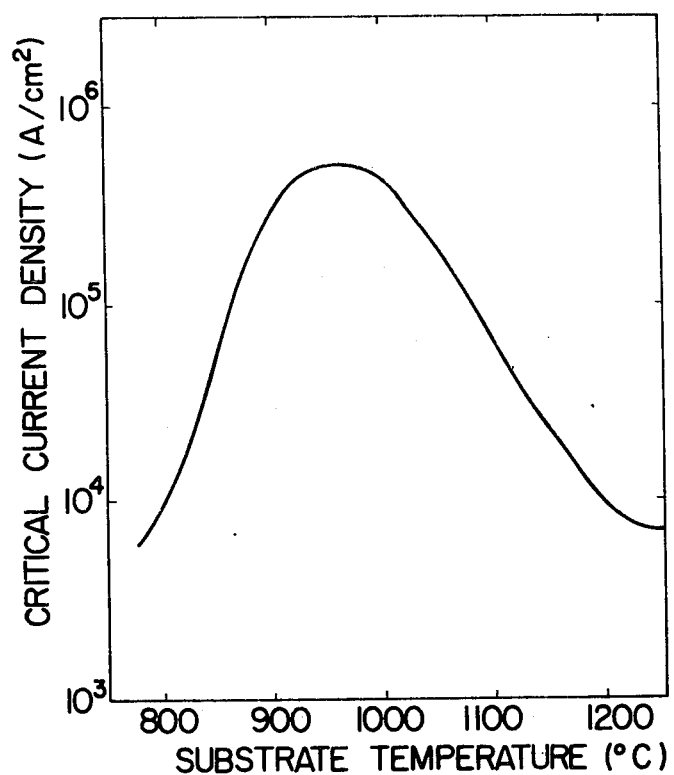
FIG. 16 shows a curve illustrating the relation between the substrate temperature at the vacuum deposition of a Nb-Ga-Al film and the critical current density at 70 KOe.

With respect to Nb-Ga-Al films having an composition giving the highest critical temperature among samples vacuum deposited at the same substrate temperature, the alumina substrate temperature at the vacuum deposition step and the critical current density at 70 KOe were plotted to obtain results shown in FIG. 16, from which it is seen that in order to obtain a critical current density of at least $10^4$ A/cm$^2$ the substrate temperature at the vacuum deposition step should be within a range of about 800° to about 1,200°C.

Neither cracking nor peeling was observed in superconductive films prepared in this Example.

With respect to a superconductive element having a Nb-Ga-Al film of a composition of $Nb_3(Ga_{0.8}Al_{0.2})$ obtained in this Example, the relation between the intensity of the magnetic field and the critical current density was plotted in the same manner as in Example 1 to obtain curve 104 of FIG. 8, from which it is seen that this superconductive element is much superior to those obtained according to the conventional techniques.

EXAMPLE 5

This Example illustrates an embodiment in which the vacuum deposition is conducted in the same manner as described in Example 1 by employing as a substrate a plate of Mo, Nb, Ta or W on the surface of which an alumina film is formed.

Formation of an alumina film can be accomplished by the anodic oxidation method, the alumina vacuum deposition method using an electron gun, and the like. In case it is desired to obtain an alumina film having a dense structure and being stable at high temperatures, adoption of the vacuum deposition method using an electron gun is considered to be appropriate. Since an alumina film obtained by the anodic oxidation has a coarse structure, it is not suitable for uses at about 1,000°C. In this Example, an alumina film was formed in a thickness of 1μm on a metal plate by vacuum depositing alumina at a metal plate temperature higher than 500°C. with use of an electron gun. In the same manner as Example 1, Nb-Al films were prepared by employing the so alumina-vacuum deposited metal plate as a substrate, and the critical temperature and critical density were determined and their relations to the substrate temperature at the vacuum deposition step were examined. Obtained results were substantially the same as those obtained in Example 1 where alumina was employed as a substrate.

EXAMPLE 6

Figure 17:
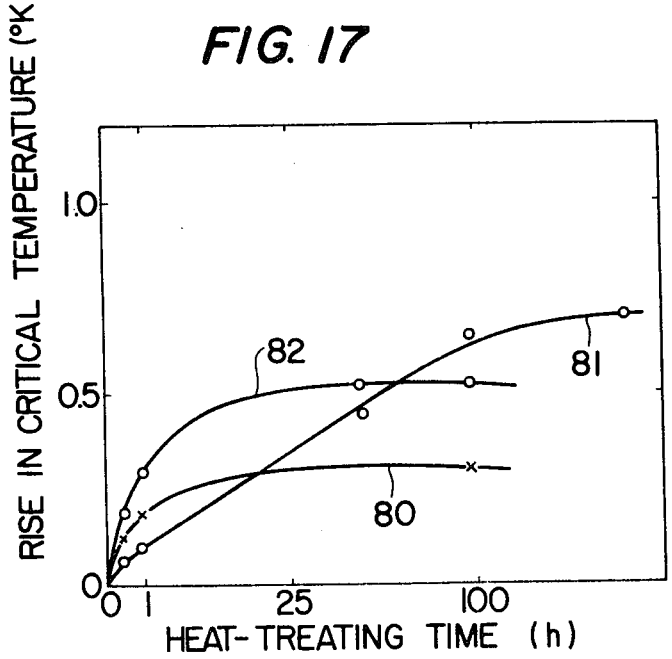
FIG. 17 shows curves illustrating the relation between the heat treatment time of a Nb-Al film and the rise in the critical temperature, obtained when the heat treatment temperature is used as a parameter.

A Nb-Al film obtained by conducting the vacuum deposition at a substrate temperature of 900°C. according to the method described in Example 1 was subjected to the vacuum heat treatment. It was found that the effect of increasing the critical temperature was attained by this vacuum heat treatment. Prior to this vacuum heat treatment an alumina film of a thickness of about 1μm was formed by the vacuum deposition method on the surface of the Nb-Al film so as to prevent reevaporation of aluminum during the vacuum heat treatment. The vacuum heat treatment was conducted under a pressure of $1 \times 10^{-6}$ Torr. FIG. 17 illustrates the relation between the rise of the critical temperature and the heat treating time, obtained when the vacuum heat treatment was conducted at 600°C. (curve 80), 700°C. (curve 81) or 800°C. (curve 82). From the results shown in FIG. 17, it is seen that at each heat treatment temperature the effect of the heat treatment is manifested when the heat treatment is conducted for more than 0.5 hour and that the saturated value is reached within about 100 hours.

As is apparent from the foregoing examples, according to this invention there can be obtained excellent superconductive elements having a superconductive film of the Nb-Al, Nb-Ga, Nb-Al-Ge or Nb-Ga-Al system compound, which have a high critical current density in either a low magnetic field or a high magnetic field and also have a high critical temperature and in which neither cracking nor peeling is caused to occur. This invention is expected to give a superconductive magnet capable of generating a magnetic field higher than the highest magnetic field now attainable by available superconductive elements (about 150 KG attained by the Nb$_3$Sn material).

It will be appreciated that the alumina substrates useful for this invention usually have a thickness of from about 0.1 to about 5 mm; whereas the alumina coating may be from about 1 to about 15 microns thick. The superconductive material is from about 0.5 to 50 microns thick.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What we claim is:

1. A superconductive element comprising a substrate, at least one face portion of which is composed of alumina, and a layer of a superconductive material formed to cover said face portion composed of alumina, said superconductive material consisting essentially of an intermetallic compound selected from the group consisting of a compound represented by the formula $Nb_j(Al_{1-x}Ge_x)$ in which the value of $j$ is within a range of from 2.3 to 4.0 and the value of $x$ is within a range of from 0 to 0.5, and a compound represented by the formula $Nb_k(Ga_{1-x}Al_x)$ in which the value of $k$ is within a range of from 2.3 to 4.9 and the value of $x$ is within a range of from 0 to 0.5.

2. The superconductive element of claim 1, wherein said substrate is composed of a metal plate and an alumina layer disposed thereon to form said face portion, said metal being a member selected from the group consisting of Mo, Nb, Ta, W, stainless steel and super alloys.

3. The superconductive element of claim 1, in which said substrate is composed entirely of alumina having a thermal expansion coefficient of $8 \times 10^{-6}$/deg.

4. The superconductive element of claim 1 wherein said element is heat treated at 600° to 800°C. for at least 0.5 hour.

5. The superconductive element of claim 1, wherein said layer of a superconductive material is a vacuum evaporated layer.

6. The superconductive element of claim 1, wherein the thickness of said layer of a superconductive material is about 0.5 to 50 microns.

7. The superconductive element of claim 6, wherein said substrate is composed entirely of alumina having a thickness of about 0.1 to about 5 mm.

8. The superconductive element of claim 6, wherein said substrate is composed of a metal plate made from a metal selected from the group consisting of Mo, Nb, Ta, W, stainless steel and superalloys and an alumina layer deposited thereon to form said face portion, said alumina layer having a thicknesss of about 1 to about 15 microns.

9. The superconductive element of claim 1, wherein the critical current density of the superconductive element in an applied magnetic field of approximately 250 KOe is greater than $10^4$ A/cm$^2$.

10. A superconductive element comprising a substrate, at least one face portion of which is composed of alumina, and a layer of a superconductive material formed to cover said face portion composed of alumina, said superconductive material consisting essentially of an intermetallic compound represented by the formula $Nb_j(Al_{1-x}Ge_x)$ in which the value of $j$ is within a range of from 2.3 to 4.0 and the value of $x$ is within a range of 0 to 0.5.

11. The superconductive element of claim 10, wherein said layer of a superconductive material is a vacuum evaporated layer.

12. A superconductive element comprising a substrate, at least one face portion of which is composed of alumina, and a layer of a superconductive material formed to cover said face portion composed of alumina, said superconductive material consisting essentially of an intermetallic compound represented by the formula $Nb_k(Ga_{1-x}Al_x)$ in which the value of $k$ is within a range of from 2.3 to 4.9 and the value of $x$ is within a range of 0 to 0.5.

13. The superconductive element of claim 12, wherein said layer of a superconductive material is a vacuum evaporated layer.

14. A method for producing superconductive elements, which comprises the steps of:
  a. providing a substrate having at least one face portion composed of alumina, and
  b. depositing a superconductive material layer on said alumina face portion of the substrate by the vacuum evaporated method, said superconductive material consisting essentially of an intermetallic compound selected from the group consisting of a compound represented by the formula $Nb_j(Al_{1-x}Ge_x)$ in which the value of $j$ is within a range of from 2.3 to 4.0 and the value of $x$ is within a range of from 0 to 0.5, and a compound represented by the formula $Nb_k(Ga_{1-x}Al_x)$ in which the value of $k$ is within a range of from 2.3 to 4.9 and the value of $x$ is within a range of 0 to 0.5.

15. The method of claim 14 wherein said substrate is composed of a metal plate and an alumina layer disposed thereon, said metal being a member selected from the group consisting of Mo, Nb, Ta, W, stainless steel and super alloys.

16. The method of claim 15 wherein said alumina layer is deposited on said metal plate by the vacuum evaporation method with use of an electron gun.

17. The method of claim 14 wherein said substrate is heated at 800° to 1,200°C. in the step (b) and said superconductive material consists essentially of a compound selected from the group consisting of a compound represented by the formula $Nb_jAl$ in which the value of $j$ is within a range of from 2.3 to 4.0, and a compound represented by the formula $Nb_k(Ga_{1-x}Al_x)$ in which the value of $k$ is within a range of from 2.3 to 4.9 and the value of six is within a range of from 0 to 0.5.

18. The method of claim 14 wherein said substrate is heated at 850° to 1,200°C. in the step (b) and said superconductive material consists essentially of a compound represented by the formula $Nb_j(Al_{1-x}Ge_x)$ in which the value of $j$ is within a range of from 2.3 to 4.0 and the value of $x$ is defined by $0 < x \leq 0.5$.

19. The method of claim 14 wherein the superconductive element obtained in the step (b) is heat treated at 600° to 800°C. for at least 0.5 hour.

* * * * *